(12) United States Patent
Pressel et al.

(10) Patent No.: US 7,910,404 B2
(45) Date of Patent: Mar. 22, 2011

(54) METHOD OF MANUFACTURING A STACKED DIE MODULE

(75) Inventors: Klaus Pressel, Regensburg (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 217 days.

(21) Appl. No.: 12/205,294

(22) Filed: Sep. 5, 2008

(65) Prior Publication Data

US 2010/0062563 A1 Mar. 11, 2010

(51) Int. Cl.
*H01L 21/00* (2006.01)

(52) U.S. Cl. . 438/109; 438/113; 438/127; 257/E21.501; 257/E21.503

(58) Field of Classification Search ............ 438/106, 438/109, 113, 127, FOR. 379, FOR. 384; 257/E21.501–E21.504
See application file for complete search history.

(56) References Cited

U.S. PATENT DOCUMENTS

| | | | | |
|---|---|---|---|---|
| 4,824,006 A * | 4/1989 | Shimizu | | 228/10 |
| 6,309,911 B2 * | 10/2001 | Hyoudo et al. | | 438/113 |
| 6,340,846 B1 * | 1/2002 | LoBianco et al. | | 257/783 |
| 6,492,726 B1 * | 12/2002 | Quek et al. | | 257/723 |
| 7,022,549 B2 | 4/2006 | Hedler et al. | | |
| 7,091,595 B2 | 8/2006 | Fuergut et al. | | |
| 7,208,345 B2 | 4/2007 | Meyer et al. | | |
| 7,274,110 B2 | 9/2007 | Meyer et al. | | |
| 7,326,592 B2 | 2/2008 | Meyer et al. | | |
| 2004/0166238 A1 * | 8/2004 | Nowicki et al. | | 427/207.1 |
| 2006/0197187 A1 | 9/2006 | Lohninger et al. | | |
| 2007/0152345 A1 * | 7/2007 | Wu et al. | | 257/777 |
| 2008/0105966 A1 | 5/2008 | Beer et al. | | |

OTHER PUBLICATIONS

M. Brunnbauer et al., "Embedded Wafer Level Ball Grid Array (eWLB)"; Electronics Packaging Technology Conference, IEEE; pp. 1-5; © 2006.
J. Fjelstad, Verdant Electronics article entitled "Integrating IC Packages and Substrates for Improved Assembly Cost and Reliability"; 56 pgs; Nov. 8, 2007.
Asymtek webpage entitled "Dam & Fill Dispensing"; available at http://www.asymtek.com/Applications/dam_fill.htm; 1 pg.; © 2008.
Asymtek webpage entitled "DJ-9000 DispenseJet Valve—Speed, Flexibility, Process Control, Experience"; available at http://www.asymtek.com/products/dj_9000_jetting.htm; 2 pgs.; © 2008.
Article entitled "Commercial Applications of Digital Printing Technologies on PCBs"; 9 pgs; undated.
DELO Industrie Klebstoffe GMBH & Co. webpage entitled "Smart Card / Smart Label"; available at http://www.delo.de/index.php?level=2&id=3&leaf=33&lang=en; 1 pg.; undated.

* cited by examiner

*Primary Examiner* — Matthew S Smith
*Assistant Examiner* — Quovaunda Jefferson
(74) *Attorney, Agent, or Firm* — Dicke, Billig & Czaja, PLLC

(57) ABSTRACT

A method of manufacturing a stacked die module includes applying a plurality of stacked die structures to a carrier. Each stacked die structure includes a first semiconductor die applied to the carrier and a second semiconductor die stacked over the first semiconductor die. The second semiconductor die has a larger lateral surface area than the first semiconductor die. A dam is applied around each of the stacked die structures, thereby forming an enclosed cavity for each of the stacked die structures. The enclosed cavity for each stacked die structure surrounds the first semiconductor die of the stacked die structure.

19 Claims, 6 Drawing Sheets

METHOD OF MANUFACTURING A STACKED DIE MODULE

BACKGROUND

Recently, wafer level processes have become increasingly attractive for various reasons, including the potential of these processes to provide for small package design of semiconductor devices and savings in manufacturing cost. Such processes can be used to produce a package with multiple stacked die to increase the effective semiconductor area in the package.

SUMMARY

One embodiment provides a method of manufacturing a stacked die module. The method includes applying a plurality of stacked die structures to a carrier. Each stacked die structure includes a first semiconductor die applied to the carrier and a second semiconductor die stacked over the first semiconductor die. The second semiconductor die has a larger lateral surface area than the first semiconductor die. A dam is applied around each of the stacked die structures, thereby forming an enclosed cavity for each of the stacked die structures. The enclosed cavity for each stacked die structure surrounds the first semiconductor die of the stacked die structure.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
FIGS. 1A-1L are diagrams illustrating a method of manufacturing a stacked die module according to one embodiment.

FIGS. 1A-1L are diagrams illustrating a method of manufacturing a stacked die module according to one embodiment. As shown in FIG. 1A, a carrier plate 104 is provided, and an adhesive layer (e.g., adhesive tape or adhesive foil) 102 is laminated on the carrier plate 104 using a lamination tool. In one embodiment, the carrier plate 104 is a metal plate.

Figure 1B:
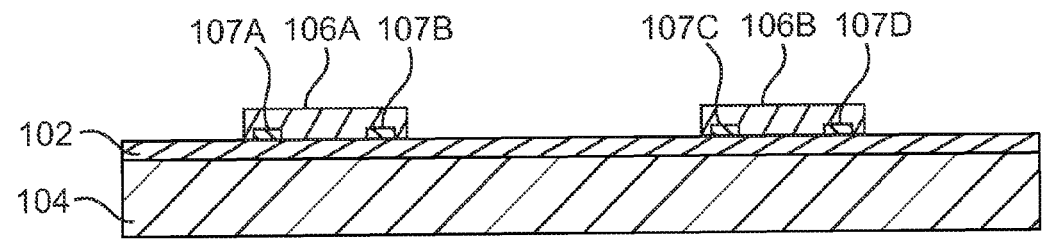

As shown in FIG. 1B, a first plurality of semiconductor dies 106A and 106B is applied to the adhesive layer 102. In one embodiment, a pick-and-place tool is used to take individual semiconductor dies 106A and 106B from a singulated semiconductor wafer, and place the dies 106A and 106B on the layer 102, with the active surfaces of the semiconductor dies 106A and 106B facing the layer 102. The semiconductor dies 106A and 106B are arranged in a spaced-apart relationship on the layer 102.

Semiconductor die 106A includes contact pads 107A and 107B, and semiconductor die 106B includes contact pads 107C and 107D. An active surface of a die according to one embodiment is defined by a surface of the die that comprises contact pads. Thus, the active surface of each die 106A and 106B is covered by the adhesive layer 102, and a backside surface of each die 106A and 106B (which is the surface opposite to the active surface) is uncovered or exposed in FIG. 1B.

Figure 1C:
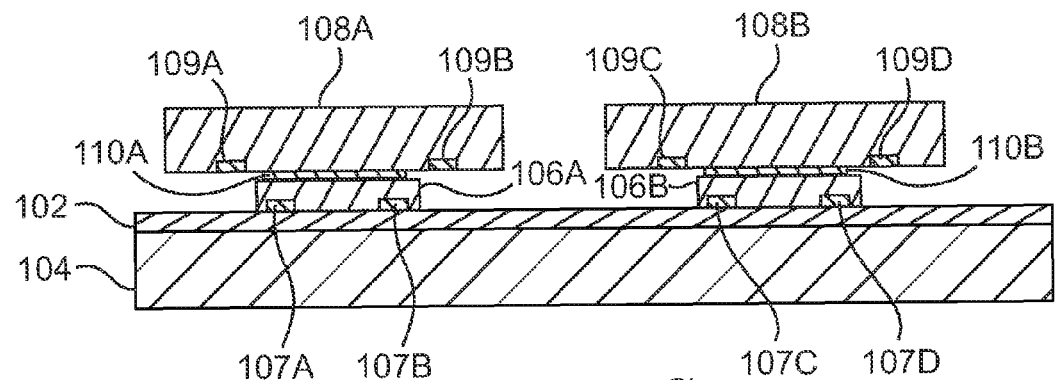

As shown in FIG. 1C, a second plurality of semiconductor dies 108A and 108B is stacked over respective ones of the first plurality of semiconductor dies 106A and 106B. Semiconductor die 108A is placed over semiconductor die 106A to form a first multi-die stack, and semiconductor die 108B is placed over semiconductor die 106B to form a second multi-die stack. In one embodiment, a pick-and-place tool is used to take individual semiconductor dies 108A and 108B from a singulated semiconductor wafer, and place the dies 108A and 108B on semiconductor dies 106A and 106B, respectively, with the active surfaces of the semiconductor dies 108A and 108B facing the backside surface of semiconductor dies 106A and 106B.

Semiconductor die 108A includes contact pads 109A and 109B, and semiconductor die 108B includes contact pads 109C and 109D. The active surfaces of dies 108A and 108B face the backside surfaces of dies 106A and 106B, respectively, and the backside surface of each die 108A and 108B is uncovered or exposed in FIG. 1C. In one embodiment, semiconductor dies 106A and 106B are micro flip chip bonded to semiconductor dies 108A and 108B, respectively, and underfill layers 110A and 110B are positioned between the dies.

In one embodiment, semiconductor dies 106A, 106B, 108A, and 108B each include four vertical side surfaces that are perpendicular to the lateral active surfaces and the lateral backside surfaces of these dies, and that define an outer perimeter of these dies. In the illustrated embodiment, dies 108A and 108B have larger lateral dimensions and a larger lateral surface area than dies 106A and 106B, so die 108A extends beyond the vertical side surfaces of die 106A and die 108B extends beyond the vertical side surfaces of die 106B. In one embodiment, dies 106A, 106B, 108A, and 108B each include one or more integrated circuits, such as logic circuits, control circuits, microprocessors, microelectro-mechanical components, and power semiconductor devices such as power transistors, power diodes, IGBTs (Insulated Gate Bipolar Transistors), as well as other types of circuits.

Figure 1D:
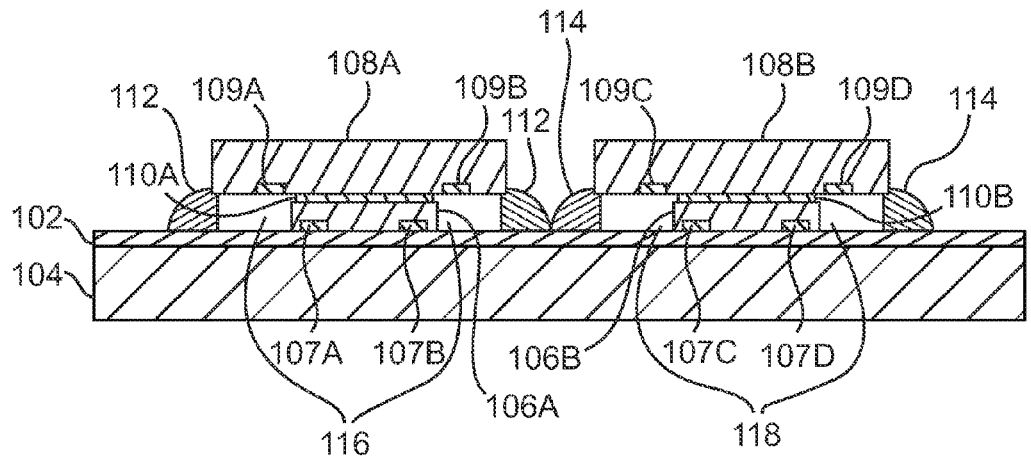

As shown in FIG. 1D, a dam 112 that surrounds dies 106A and 108A is applied to layer 102 adjacent to the outer perimeter of die 108A, and a dam 114 that surrounds dies 106B and 108B is applied to layer 102 adjacent to the outer perimeter of die 108B. In one embodiment, dams 112 and 114 are applied by dispensing (e.g., needle dispensing) or printing (e.g., jet printing). In one embodiment, the dams 112 and 114 are formed from a photo-curable epoxy resin, with ultraviolet light curing being performed simultaneously with the application of the dams, and heat curing being performed after applications of the dams. In the illustrated embodiment, the dams 112 and 114 have at least the same height or thickness as dies 106A and 106B. Application of the dam 112 results in an enclosed cavity 116 that surrounds die 106A, and application of the dam 114 results in an enclosed cavity 118 that surrounds die 106B. Pads 109A and 109B of die 108A are located in the enclosed cavity 116, and pads 109C and 109D of die 108B are located in the enclosed cavity 118.

Figure 2:
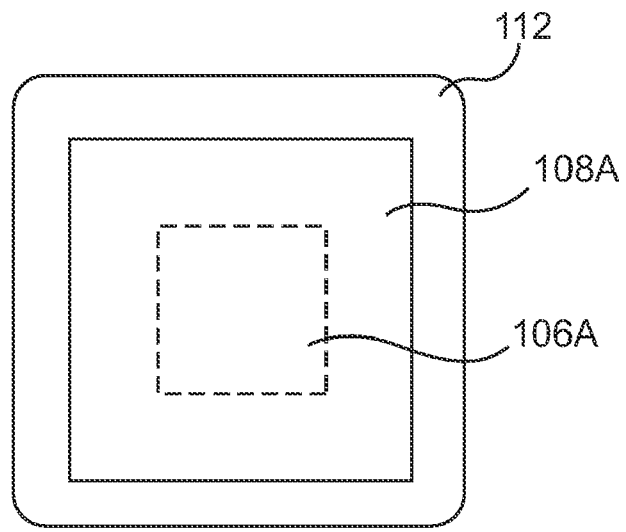
FIG. 2 is a diagram illustrating a top view of the stacked dies shown in FIG. 1D according to one embodiment.

FIG. 2 is a diagram illustrating an ideal top view of the stacked dies 106A and 108A shown in FIG. 1D according to one embodiment. As shown in FIG. 2, the dam 112 surrounds dies 106A and 108A, and makes contact with die 108A along an entire outer perimeter of die 108A.

Figure 1E:
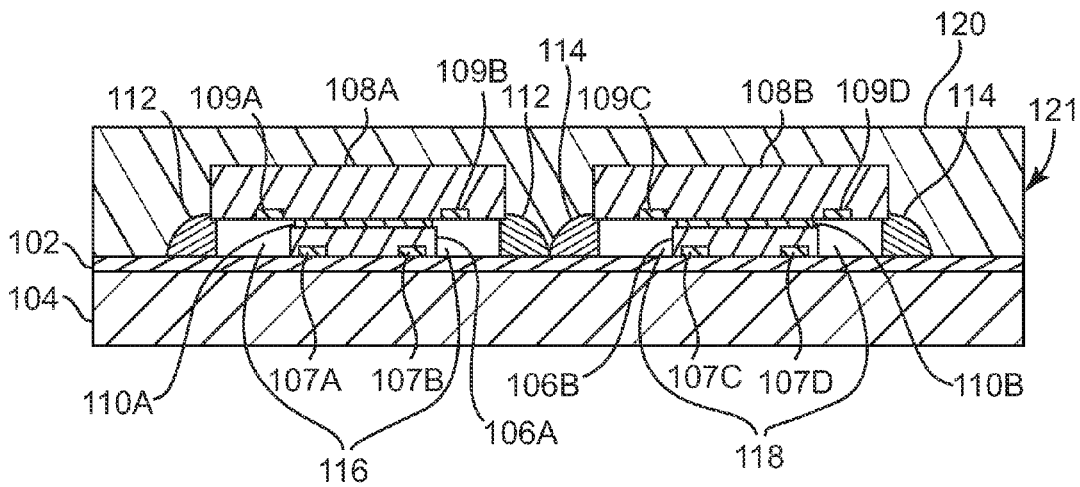

As shown in FIG. 1E, a mold layer 120 is applied over the semiconductor dies 106A, 106B, 108A, and 108B, the dams 112 and 114, and the adhesive layer 102, thereby encapsulating the semiconductor dies 106A, 106B, 108A, and 108B, and the dams 112 and 114. In the illustrated embodiment, the mold layer 120 covers the vertical side surfaces and the backside surfaces of the semiconductor dies 108A and 108B, but does not come in contact with the semiconductor dies 106A and 106B. The dams 112 and 114 prevent the mold material from entering the cavities 116 and 118.

The mold material for mold layer 120 according to one embodiment may be of any appropriate thermoplastic, duroplastic or thermosetting material. In one embodiment, the mold layer 120 comprises a polymer that is applied using a compression molding process. In another embodiment, injection molding, lamination, dispensing, printing or other technique, may be used to apply mold layer 120. By way of example, in a compression molding process, a liquid mold material is dispensed over the dies 106A, 106B, 108A, and 108B. The carrier 104 with the adhesive layer 102 applied thereon forms the bottom of a lower mold of a mold tool (not illustrated). After dispensing the liquid mold material, an upper mold half is moved down and spreads out the liquid molding material. This process may be accompanied by the application of heat and pressure. After curing, the mold material is rigid and forms the mold layer 120.

The combination of the semiconductor dies 106A, 106B, 108A, and 108B, the dams 112 and 114, and the mold layer 120 according to one embodiment is referred to herein as a molded reconfigured wafer 121, but any other format (e.g., rectangular) could be performed. In one embodiment, the reconfigured wafer 121 has the same geometry and dimensions as a standard silicon wafer, such as, for example, a 200 mm silicon wafer. After curing, the molded body including the mold layer 120 provides a rigid structure accommodating a plurality (e.g., typically more than 50) stacked semiconductor die structures.

Figure 1F:
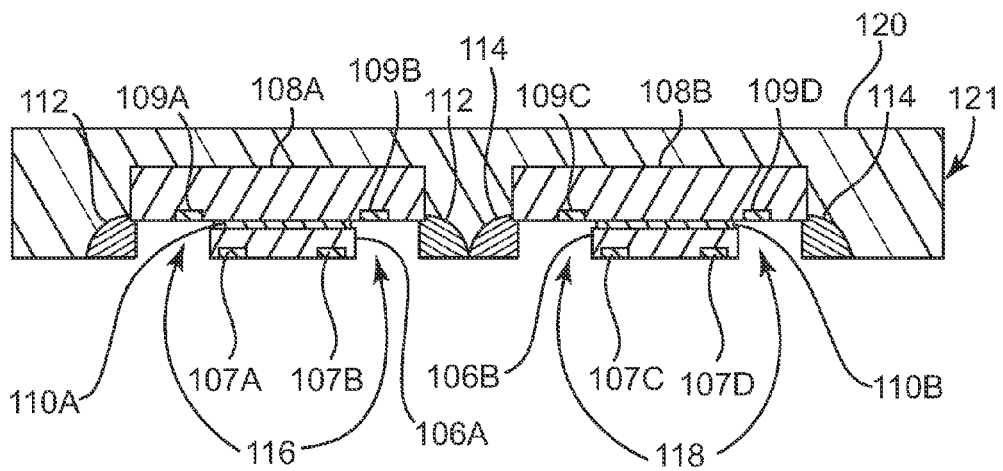
Figure 1G:
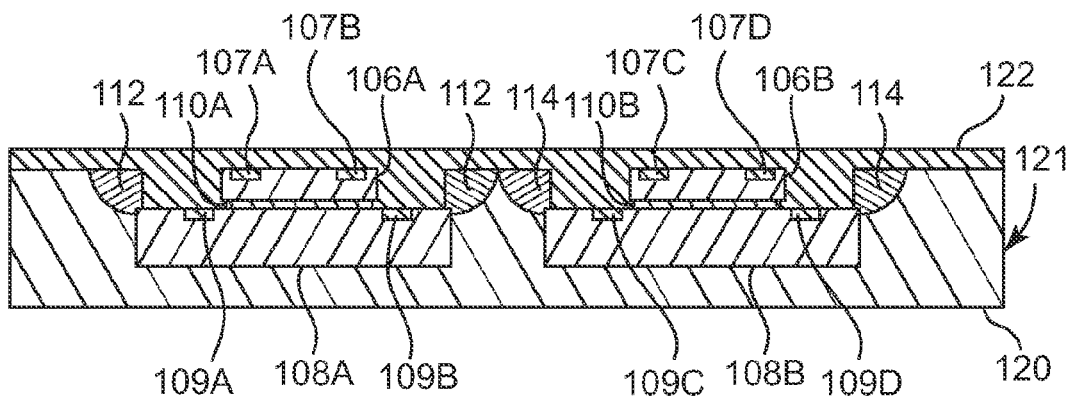
Figure 1H:
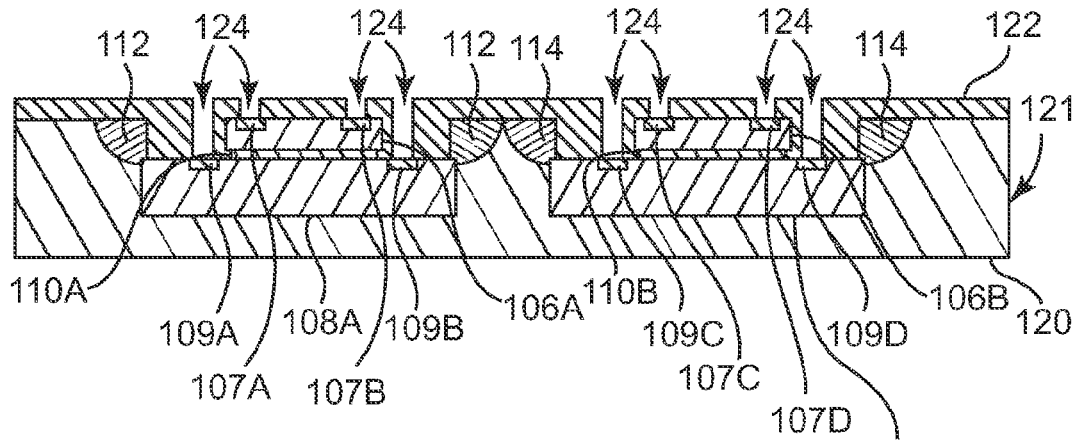

As shown in FIG. 1F, the adhesive layer 102 and the carrier plate 104 are removed from the reconfigured wafer 121, thereby exposing pads 107A-107D and 109A-109D. In FIG. 1G, the reconfigured wafer 121 has been turned upside down, and a dielectric layer 122 that covers the pads 107A-107D and 109A-109D has been applied to the reconfigured wafer 121. In one embodiment, dielectric layer 122 is applied by spin coating, spray coating, or printing. As shown in FIG. 1H, the dielectric layer 122 has been lithographically processed to remove material from dielectric layer 122 in the regions of the pads 107A-107D and 109A-109D, thereby forming openings 124 and exposing the pads 107A-107D and 109A-109D. The openings 124 for the pads 109A-109D of the dies 108A and 108B are deeper than the openings 124 for the pads 107A-107D of dies 106A and 106B. The different thicknesses or depths of the openings 124 can be controlled by using different exposure times. In one embodiment, laser direct imaging (LDI) is used to form openings 124, and different energy densities are used to create openings 124 with different depths. In another embodiment, the openings 124 are produced by laser ablation.

The dams 112 and 114 according to one embodiment simplify the process for forming the openings 124 for pads 109A-109D of dies 108A and 108B. Without the dams 112 and 114, the cavities 116 and 118 would be filled with mold material from mold layer 120. The mold layer 120 may be filled with $SiO_2$ particles, which can make it difficult to lithographically process the mold layer 120 to form the openings 124. In the case of laser ablation, it is also difficult to remove such fillers. The dams 112 and 114 form sealed enclosures that help to ensure that no mold material from layer 120 covers the pads 109A-109D of the dies 108A and 108B, which simplifies the process for forming the openings 124 for pads 109A-109D.

Figure 1I:
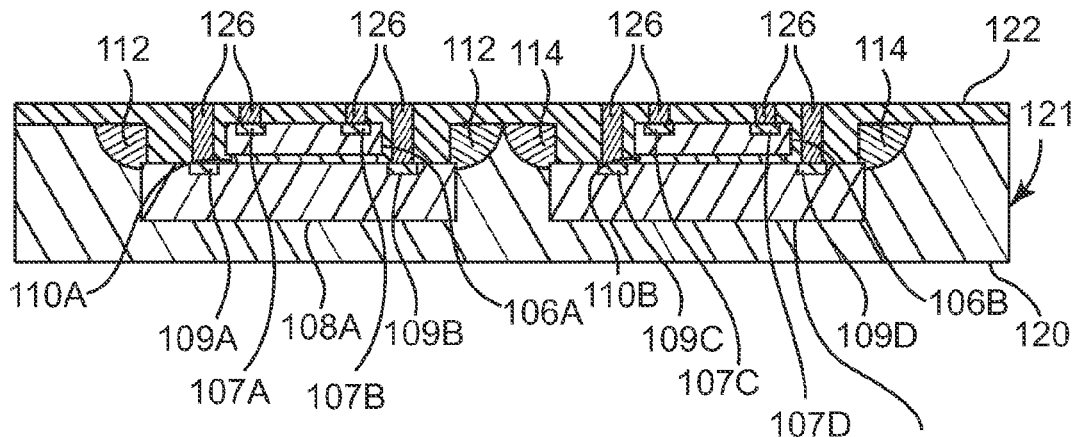
Figure 1J:
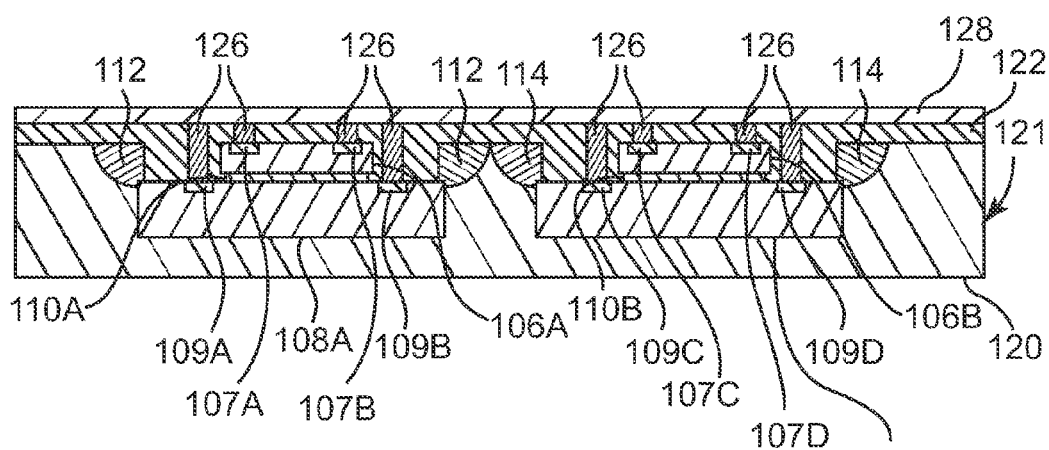
Figure 1K:
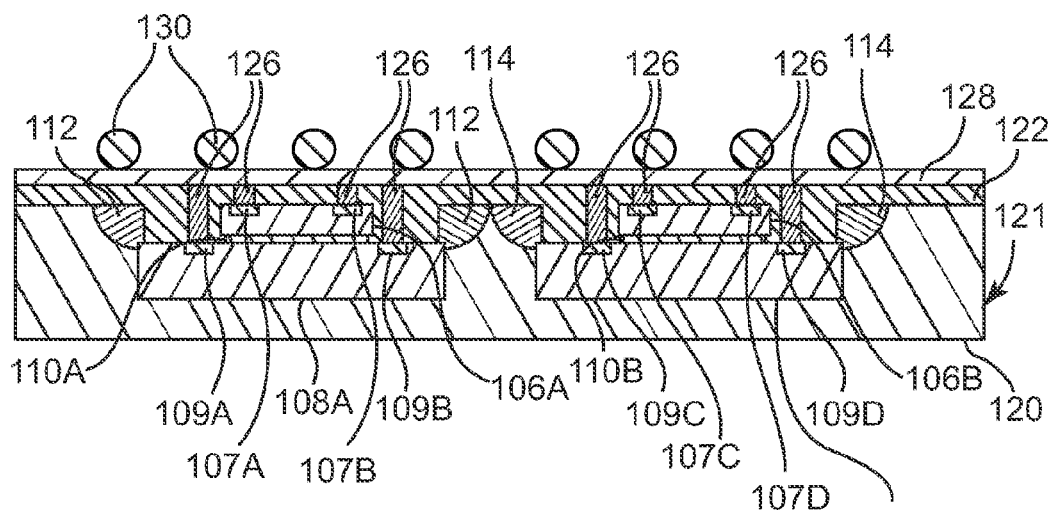
Figure 1L:
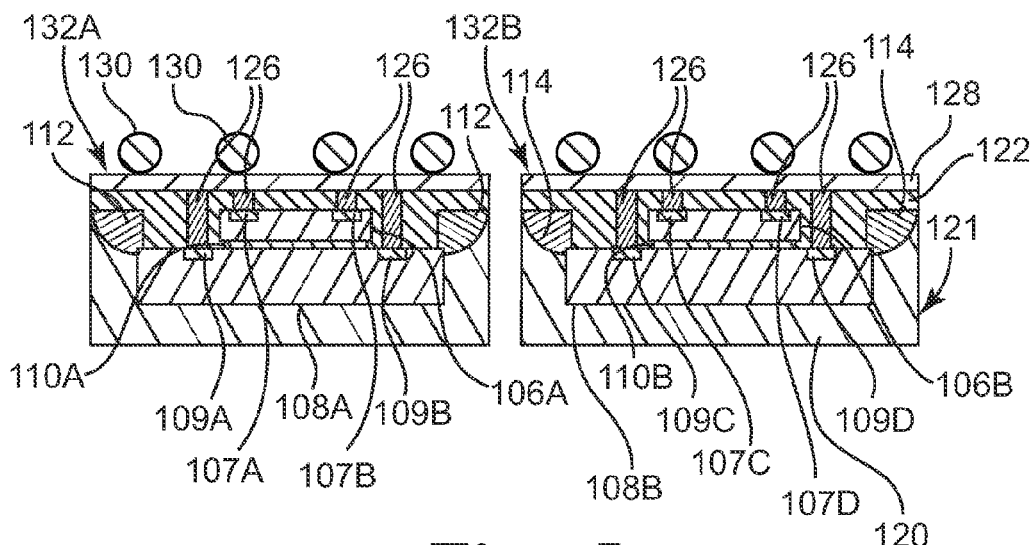

As shown in FIG. 1I, conductive pillars 126 are formed in the cavities 124. Conductive pillars 126 are in electrical contact with pads 107A-107D and 109A-109D. As shown in FIG. 1J, a redistribution layer 128 is applied to the reconfigured wafer 121. Redistribution layer 128 is in electrical contact with the conductive pillars 126. In one embodiment, the redistribution layer 128 and the conductive pillars 126 are processed simultaneously. As shown in FIG. 1K, an array of electrical interconnect elements (e.g., solder elements such as solder balls) 130 is applied on the redistribution layer 128. The redistribution layer 128 includes a plurality of conductive traces (not shown) for electrically interconnecting the conductive pillars 126 with the solder balls 130. As shown in FIG. 1L, the reconfigured wafer 121 with the redistribution layer 128 and solder balls 130 formed thereon is singulated into a plurality of individual encapsulated stacked die modules 132A and 132B. The solder balls 130 provide external contact means to mount the modules 132A and 132B onto a mounting platform such as a printed circuit board (PCB). In the illustrated embodiment, the modules 132A and 132B are each embedded wafer level ball grid array (eWLB) packages that are made using wafer-level packaging, with singulation occurring after application of the solder balls 130 at the wafer level.

Figure 3:
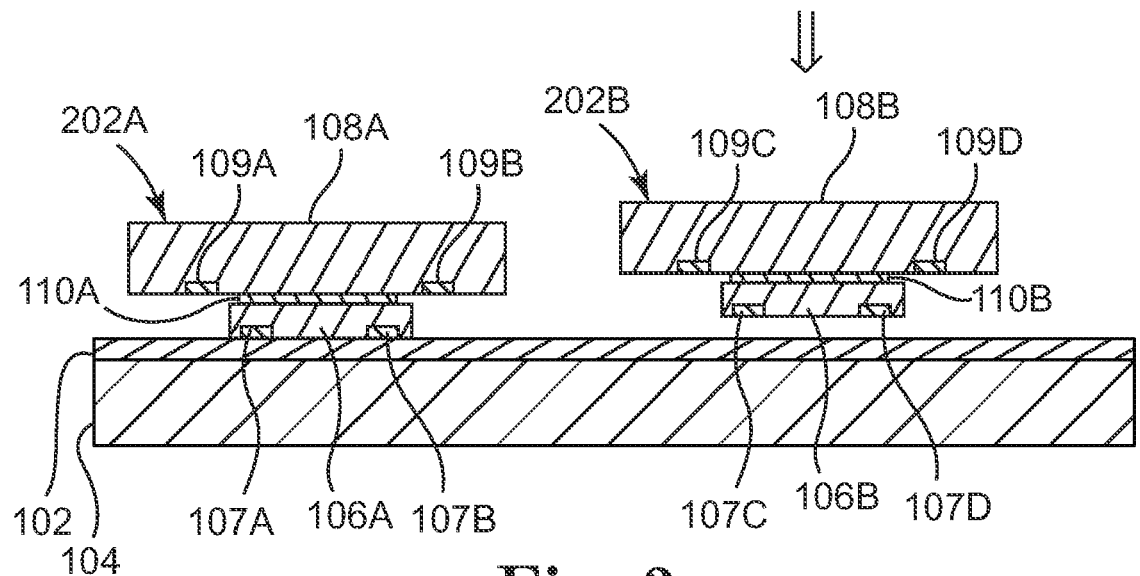
FIG. 3 is a diagram illustrating the placement of a multi-die stack on a substrate according to one embodiment.

In the embodiment shown in FIGS. 1A-1L, multi-die stacks are formed by first placing dies 106A and 106B on adhesive layer 102 (FIG. 1B), and then placing dies 108A and 108B over dies 106A and 106B, respectively (FIG. 1C). In another embodiment, the multi-die stacks are pre-formed, and the pre-formed stacks are applied to layer 102. In one form of this embodiment, each pre-formed die stack includes two or more semiconductor dies. FIG. 3 is a diagram illustrating the placement of a multi-die stack on a substrate according to one embodiment. As shown in FIG. 3, dies 106A and 108A are pre-formed (e.g., bonded together using, for example, a die to wafer bonding process, prior to attachment to the substrate) into a multi-die stack 202A that is applied to layer 102, and dies 106B and 108B are pre-formed into a multi-die stack 202B that is applied to layer 102. In one embodiment, dies 106A and 106B are flip chip bonded to the dies 108A and 108B, respectively. In one form of this embodiment, the pads 107A-107D face the active surface of dies 108A and 108B, and one or more of the pads 107A-107D are connected to one or more of the pads 109A-109D.

Figure 4:
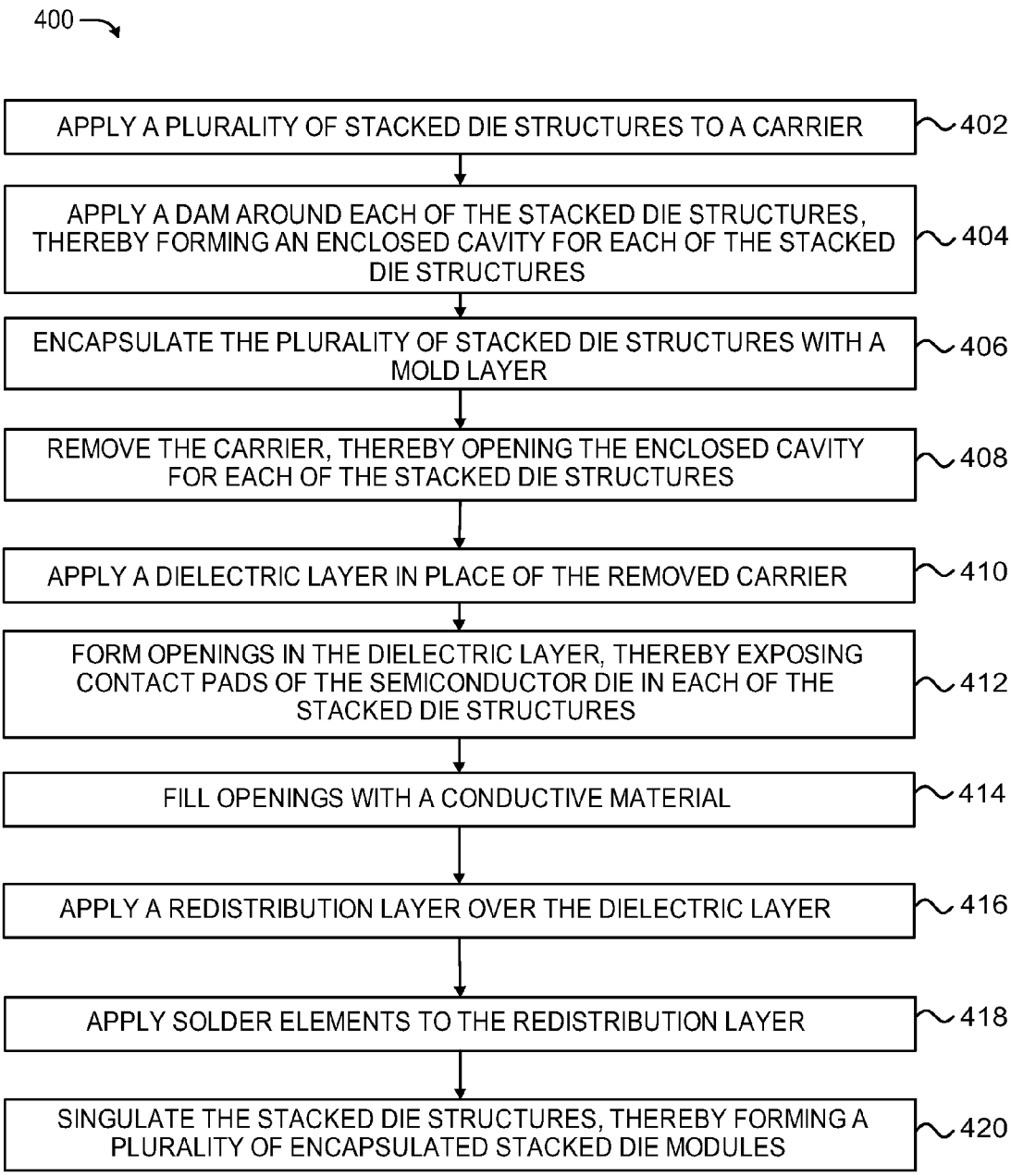
FIG. 4 is a flow diagram illustrating a method of manufacturing a stacked die module according to one embodiment.

FIG. 4 is a flow diagram illustrating a method 400 of manufacturing a stacked die module according to one embodiment. At 402, a plurality of stacked die structures is applied to a carrier. In one embodiment, each of the stacked die structures applied at 402 includes a first semiconductor die applied to the carrier and a second semiconductor die stacked over the first semiconductor die. In one embodiment, the second semiconductor die has a larger lateral surface area than the first semiconductor die. At 404, a dam is applied around each of the stacked die structures, thereby forming an enclosed cavity for each of the stacked die structures. In one embodiment, the enclosed cavity formed at 404 for each stacked die structure surrounds the first semiconductor die of the stacked die structure. At 406, the plurality of stacked die structures is encapsulated with a mold layer. In one embodiment, the dam around each of the stacked die structures prevents the mold layer from entering the enclosed cavity during the encapsulation.

At 408, the carrier is removed, thereby opening the enclosed cavity for each of the stacked die structures. At 410, a dielectric layer is applied in place of the removed carrier. At 412, openings are formed in the dielectric layer, thereby exposing contact pads of the first semiconductor die and second semiconductor die in each of the stacked die structures. At 414, the openings are filled with a conductive material. At 416, a redistribution layer is applied over the dielectric layer. In one embodiment, steps 414 and 416 are performed simultaneously. At 418, solder elements are applied to the redistribution layer. At 420, the stacked die structures are singulated, thereby forming a plurality of encapsulated stacked die modules.

It will be understood by persons of ordinary skill in the art that the techniques disclosed herein are also applicable to stacked die modules that include more than two stacked dies per module (e.g., three or more dies in a stack per module), as well as modules that combine multiple stacks, and modules that combine one or more die stacks with one or more non-stacked die.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a stacked die module, the method comprising:
    applying a plurality of stacked die structures to a carrier, each stacked die structure including a first semiconductor die applied to the carrier and a second semiconductor die stacked over the first semiconductor die, wherein the second semiconductor die has a larger lateral surface area than the first semiconductor die;
    applying a dam around each of the stacked die structures, thereby forming an enclosed cavity for each of the stacked die structures, the enclosed cavity for each stacked die structure surrounding the first semiconductor die of the stacked die structure; and
    removing the carrier, thereby opening the enclosed cavity for each of the stacked die structures.

2. The method of claim 1, and further comprising:
    encapsulating the plurality of stacked die structures with a mold layer.

3. The method of claim 2, wherein the dam around each of the stacked die structures prevents the mold layer from entering the enclosed cavity during the encapsulation.

4. The method of claim 1, and further comprising:
    applying a dielectric layer onto the stacked die structures.

5. The method of claim 4, and further comprising:
    forming openings in the dielectric layer, thereby exposing contact pads of the first semiconductor die and the second semiconductor die in each of the stacked die structures.

6. The method of claim 5, and further comprising:
    filling the openings with a conductive material.

7. The method of claim 6, and further comprising:
    applying a redistribution layer over the dielectric layer.

8. The method of claim 7, and further comprising:
    applying solder elements to the redistribution layer.

9. The method of claim 8, and further comprising:
    singulating the stacked die structures, thereby forming a plurality of encapsulated stacked die modules.

10. The method of claim 1, wherein the dam around each of the stacked die structures is applied by needle dispensing.

11. The method of claim 1, wherein the dam around each of the stacked die structures is applied by jet printing.

12. The method of claim 1, wherein an active surface of the first and second semiconductor dies in each stacked die structure faces the carrier.

13. The method of claim 1, wherein contact pads of the second semiconductor die in each stacked die structure are positioned within the enclosed cavity for the stacked die structure.

14. The method of claim 1, wherein the stacked die structures are arranged on the carrier in a spaced apart relationship.

15. A method of manufacturing a stacked die module, the method comprising:
    providing a carrier with an adhesive layer;
    placing a first plurality of semiconductor dies on the adhesive in a spaced apart relationship;
    placing a second plurality of semiconductor dies over respective ones of the first plurality of dies, thereby forming a plurality of stacked die structures, wherein the dies in the second plurality have larger lateral dimensions than the dies in the first plurality;
    applying a dam around each of the stacked die structures, thereby forming an enclosed cavity around each of the stacked die structures;
    encapsulating the plurality of stacked die structures with a mold layer; and
    removing the carrier.

16. The method of claim 15, wherein each die in the first and second pluralities includes an active surface that faces the carrier with contact pads formed thereon.

17. The method of claim 16, and further comprising:
    applying solder elements adjacent to the active surfaces of the dies in the first and second pluralities.

18. The method of claim 17, and further comprising:
    singulating the stacked die structures after application of the solder elements, thereby forming a plurality of encapsulated stacked die modules.

19. A method of manufacturing a stacked die module, the method comprising:
    applying a plurality of stacked die structures to a carrier, each stacked die structure including a first semiconductor die having contact pads arranged on an active surface that is applied to the carrier and a second semiconductor die stacked over the first semiconductor die and having contact pads arranged on an active surface that faces the carrier, wherein the second semiconductor die has a larger lateral surface area than the first semiconductor die;

applying a dam around each of the stacked die structures, thereby forming an enclosed cavity around each of the stacked die structures;

encapsulating the plurality of stacked die structures with a mold layer;

removing the carrier;

applying solder elements electrically coupled to the contact pads of the stacked die structures; and singulating the stacked die structures after application of the solder elements, thereby forming a plurality of encapsulated stacked die modules.

* * * * *